United States Patent [19]
Tosa et al.

[11] Patent Number: 5,192,409
[45] Date of Patent: Mar. 9, 1993

[54] METHOD OF SPUTTERING A MIXTURE OF HEXAGONAL BORON NITRIDE AND STAINLESS STEEL ONTO A STEEL VESSEL AND HEATING THE FILM SO AS TO PRECIPITATE THE BORON NITRIDE ONTO THE FILM SURFACE

[75] Inventors: Masahiro Tosa; Kazuhiro Yoshihara, both of Ibaragi, Japan

[73] Assignee: National Research Institute For Metals, Tokyo, Japan

[21] Appl. No.: 863,041

[22] Filed: Apr. 3, 1992

Related U.S. Application Data

[62] Division of Ser. No. 491,428, Mar. 9, 1990.

[51] Int. Cl.$^5$ .............................................. C23C 14/00
[52] U.S. Cl. ........................... 204/192.16; 204/192.22; 148/DIG. 34; 148/DIG. 113; 148/DIG. 158
[58] Field of Search ............. 204/192.16, 192.22; 148/DIG. 34, DIG. 113, DIG. 158; 420/121

[56] References Cited

U.S. PATENT DOCUMENTS

| | | | |
|---|---|---|---|
| 3,564,565 | 2/1971 | Haberecht | 204/192.22 |
| 4,683,043 | 7/1987 | Melton et al. | 204/192.15 |
| 4,895,770 | 1/1990 | Schintlmeister et al. | 204/192.16 |

FOREIGN PATENT DOCUMENTS 60-36648  2/1985  Japan.
3-107450  7/1991  Japan.

*Primary Examiner*—Shrive Beck
*Assistant Examiner*—Benjamin L. Utech
*Attorney, Agent, or Firm*—Wenderoth, Lind & Ponack

[57] ABSTRACT

A material for high-vacuum vessels characterized by depositing a mixture film of stainless steel and boron nitride on the surface of a metal or an alloy through the sputtering process, and heating and precipitating hexagonal boron nitride onto the surface thereof.

2 Claims, 1 Drawing Sheet

METHOD OF SPUTTERING A MIXTURE OF HEXAGONAL BORON NITRIDE AND STAINLESS STEEL ONTO A STEEL VESSEL AND HEATING THE FILM SO AS TO PRECIPITATE THE BORON NITRIDE ONTO THE FILM SURFACE

This is a divisional application of pending U.S. application Ser. No. 07/491,428, filed Mar. 9, 1990.

FIELD OF THE INVENTION

The present invention relates to a low-temperature coating method for high-vacuum vessel materials, and particularly to a high-vacuum vessel material which can allow hexagonal boron nitride to precipitate on its surface by processing such materials at low temperatures without entailing any structural degradation thereof and to a low-temperature coating method.

DESCRIPTION OF THE PRIOR ART

The high-vacuum art is essential for the preparation of thin films by the molecular beam epitaxy and other methods or for the study of the surface of materials using an electronic beam. In order to achieve high-vacuum, it is important to develop materials for high-vacuum vessels which emit a small amount of gas.

At present, stainless steel is generally employed as a vacuum vessel material. However, stainless steel has certain disadvantages. Gases are apt to adhere to the surface thereof and the whole vessel must be heated to 150°~200° C., and, in some cases, to 500° C. or over, and further, it requires extended periods of time for the steel to attain high-vacuum. Accordingly, it has become necessary to provide surface treatment so that the vessel surface is inactive to the adherence of gases thereon.

As such surface treatment, it is known that the method of coating the surface of stainless steel with hexagonal boron nitride (h-Bn) film is effective.

However, this hexagonal boron nitride possesses properties inactive to the water vapor, carbon monoxide and other gases adhered thereon, but in order to achieve this chemical vapor deposition must be employed and the stainless steel structure must be heated to as high as 1000° to 2000° C. This can result in degradation of material structure, and also involves complicated procedures.

As a means to solve such problems, the inventor of the present invention has already proposed a method by which the stainless steel, to which boron and nitrogen are added, is prepared and is heated to cause the hexagonal boron nitride film to precipitate on the surface thereof. By using the stainless steel containing such added boron and nitrogen are added, it has become possible to form hexagonal boron nitride on the surface of the stainless steel significantly temperatures as low as 700° C., at lower than has been achieved in the past.

Yet, even with this method, it was still required to heat the steel at a temperature as high as 600° C. in order to coat hexagonal boron nitride onto and surface thereof, the texture degradation is unavoidable. It was virtually impossible by this method to coat the structural portion of a high-vacuum vessel, such as a manipulator, which requires strength. By this process, materials onto which hexagonal boron nitride can be coated were limited to stainless steel in which boron and nitrogen are added. Hence, hexagonal boron nitride could not be coated on the surface of aluminium, steel and other high-vacuum equipment material other than stainless steel.

The present invention has been provided to eliminate the foregoing problems associated with the prior art, and has an objective of providing a new coating process by which hexagonal boron nitride can be easily coated on metals or alloys at temperatures as low as around 300° C.

SUMMARY OF THE INVENTION

With a view to attaining the above objective, the present invention provides a high-vacuum vessel material characterized by depositing a film comprising a mixture of stainless steel and boron nitride on the surface of a metal or an alloy to be used as a high-vacuum vessel, and by causing hexagonal boron nitride to precipitate on the surface thereof.

The invention provides a method of producing high-vacuum vessel materials characterized by coating a film comprising a mixture of stainless steel and boron nitride on the surface of a metal or an alloy to be used for high-vacuum vessels by a sputtering/vacuum deposition process, and by heating the same up to about 300° C. in a vacuum to allow hexagonal boron nitride to precipitate on the surface thereof.

DETAILED DESCRIPTION OF THE INVENTION

Figure 1:
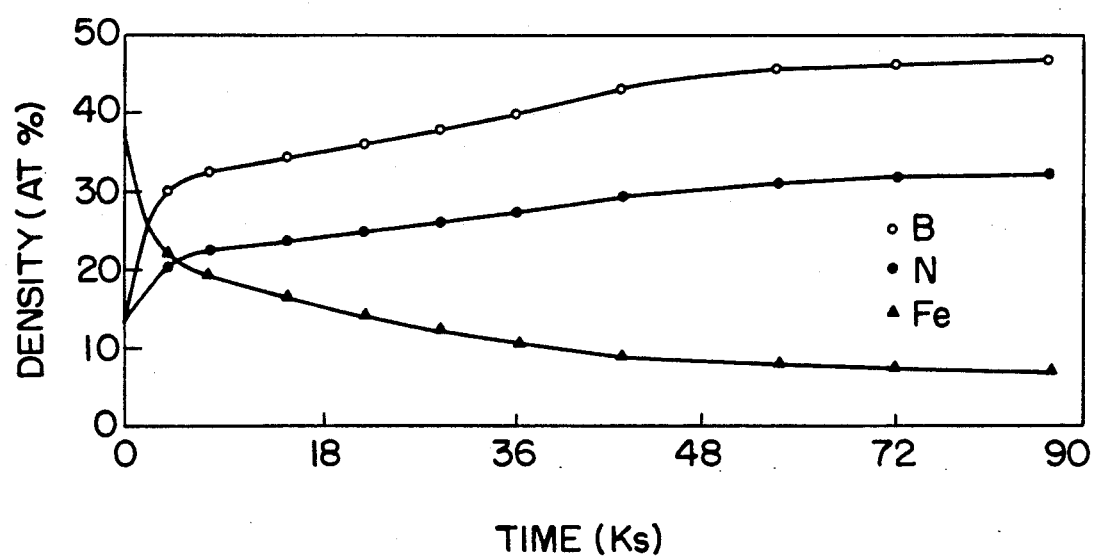
FIG. 1 is a correlation diagram of concentration and time, showing changes the surface composition of such a high-vacuum vessel material as provided in the present invention when it is heated at 330° C.

In the present invention, sputtering/vacuum deposition intended to deposit a mixture film of stainless steel and boron nitride can be accomplished by sputtering, onto the surface of a metal or metal alloy, a mixture of stainless steel and boron nitride with plasma argon gas and other gases in the vacuum. The vaporized stainless steel and boron nitride are allowed to deposit on the surface of the metal or an alloy. Preferably, as the mixture to be used herein, a mixture containing 10% or greater proportions of boron nitride can be used.

This raw material mixture can be in a bulky form in which the boron nitride is in a solid, powdery state, or a plate- or sheet-like mixture of stainless steel and boron nitride can be employed.

This method produces film comprising a mixture of stainless steel and boron nitride, so that the bond strength of the film coating on the metal or alloy after it is heated can be sufficiently great.

The degree of vacuum might be, say, $1 \times 10^{-4} \sim 1 \times 10^{-2}$ Torr level.

The metal or alloy substrate coating with the film of stainless steel/boron nitride obtained by this sputtering-/vacuum deposition is then subjected to thermal treatment to around 300° C. The heating temperature at this time can be in the range between 290° and 350° C. By subjecting the metal or alloy to thermal treatment at much lower temperatures than the 600° or 700° C. previously employed, hexagonal boron nitride can be effectively precipitated on the surface thereof.

The metals or alloys to be used are unlimited in kind, and a wide range of the materials which can be used as high-vacuum vessel materials can be employed. In this case the metals include copper, aluminum and the alloys thereof, as well as stainless steel, as in the prior art.

By the method according to present invention, it is required to maintain the vessel at only at about 300° C. or in a vacuum thereby eliminating the need for heating at 600° C. or higher, was required by the prior art. In addition, the bond strength of the coating is sufficient, and when applied as a vacuum vessel, a super high-vacuum can be achieved in a short time without baking, thereby offering excellent economic advantages over the prior art. The coated materials thus-obtained are effective as materials for vessels used as accelerators surface analyzers, MBE and other super high-vacuum equipment.

EMBODIMENT 1

Using as a target a mixture of SUS304 STAINLESS STEEL and boron nitride (containing 20% boron nitride solid solution), a 1.2 μm mixture film was deposited onto the surface of an SUS304 STAINLESS STEEL with a thickness of 0.7 mm and an area of 10 mm$^2$, using a high frequency magnetron sputtering method. After the deposition, the film was heated at 300° C. for 24 hours, resulting in the surface of said film being covered two dimensionally and uniformly with hexagonal boron nitride. The adsorption of composition of carbon and oxygen, after this specimen is exposed to the atmosphere, i.e., the water vapor, oxygen carbon monoxide and other gases, proved to be 14 percent.

EMBODIMENT 2

In Embodiment 1, when the heating temperature was 330° C., on the spot evaluations were made as to changes in the surface composition. The result is indicated in FIG. 1. The horizontal axis shows the heating time and the vertical axis indicates the composition of the various elements measure with the scanning Auger electronic spectroscopic analyzer. Immediately after the initiation of heating, the concentration of Fe decreases with increasing concentrations of B and N. The B and N condensed on the surface of the thin film turned out to be hexagonal SN based on the shapes of the Auger spectral and other information.

EMBODIMENT 3

As with Embodiment 1, using as target a mixture of SUS 304 STAINLESS STEEL and boron nitride (containing 15 percent boron nitride), 1.2 μm was deposited by the sputtering process on the surface of a steel of a thickness of 0.7 mm and an area of 10 mm$^2$. After a deposition, it was heated in the vacuum at 300° C. for 24 hours, the film surface was covered two-dimensionally and uniformly at a hexagonal boron nitride with a thickness of 4 nm. When this specimen was exposed to the atmosphere, the adsorption of the gases adhered was more than 15 percent.

EMBODIMENT 4

Using as target mixture of SUS 321 STAINLESS STEEL and boron nitride (containing 15 percent boron nitride), a 1.2 μm coating film was deposited by then sputtering process on the surface of a steel of a thickness of 0.7 mm and an area of 10 mm$^2$. After the deposition, it was heated in the vacuum at 300° C. for 24 hours and, the film surface was covered two-dimensionally and uniformly with hexagonal boron nitride having a thickness of 4 nm. When this specimen was exposed to the atmosphere, the adsorption of the gases adhered was more than 15 percent.

EMBODIMENT 5

Using as target a mixture of SUS 316 STAINLESS STEEL and boron nitride (containing 10 percent boron nitride), a 1.2 μm film was deposited by the sputtering process on the surface of a steel of a thickness of 0.7 mm and an area of 10 mm$^2$. After the deposition, it was heated in a vacuum at 300° C. for 24 hours, the film surface was covered two-dimensionally and uniformly with hexagonal boron nitride with a thickness of 4 nm. When this specimen was exposed to the atmosphere, the adsorption of the gases adhered was more than 15 percent.

REFERENCE EXAMPLE

When the reflecting electronic image of the surface after the stainless steel on which boron nitride alone is deposited through the sputtering process is observed, the thin film was found to be irregular, and was peeled. For this reason, the thin film of boron nitride alone offers poor adhesion, and hence is unsuited as a low gas emission coating.

As detailed above, the present invention serves to achieve a stainless steel/boron nitride film coating on whose surface hexagonal boron nitride with markedly low gas adsorption is allowed to precipitate by processing at much lower temperatures than that used in the previous art. Further, the bond strength of such coating was found to be sufficient.

According to the present invention, high-vacuum vessel materials are provided which are free from texture degradation due to high-temperature heating.

What is claimed is:

1. A low-temperature coating method for high-vacuum materials comprising depositing, through sputtering, a mixture film of stainless steel/boron nitride on the surface of a metal or an alloy and heating the same in a vacuum to around 300° C. to allow hexagonal boron nitride to precipitate on the surface thereof.

2. A low-temperature coating method as described in claim 1 wherein a mixture of stainless steel and boron nitride containing more than 10 percent boron nitride is made a target for the sputtering process.

* * * * *